United States Patent
Srivastava et al.

(10) Patent No.: US 6,255,670 B1
(45) Date of Patent: Jul. 3, 2001

(54) PHOSPHORS FOR LIGHT GENERATION FROM LIGHT EMITTING SEMICONDUCTORS

(75) Inventors: Alok Mani Srivastava; Anil Raj Duggal, both of Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/579,037

(22) Filed: May 26, 2000

Related U.S. Application Data

(63) Continuation-in-part of application No. 09/203,214, filed on Nov. 30, 1998, which is a continuation-in-part of application No. 09/144,134, filed on Aug. 31, 1998, now abandoned.
(60) Provisional application No. 60/073,982, filed on Feb. 6, 1998.

(51) Int. Cl.$^7$ ..................................................... H01L 33/00
(52) U.S. Cl. ............................... 257/89; 257/98; 257/99; 257/100; 313/501; 313/503
(58) Field of Search ................................ 257/88, 89, 98, 257/99, 100; 313/501, 502, 503

(56) References Cited

U.S. PATENT DOCUMENTS

| | | | | |
|---|---|---|---|---|
| 4,661,419 | * | 4/1987 | Nakamura | 428/691 |
| 5,198,679 | * | 3/1993 | Katoh et al. | 250/484.1 |
| 6,066,861 | * | 5/2000 | Höhn et al. | 257/99 |

FOREIGN PATENT DOCUMENTS

98/39805 * 9/1998 (WO).

* cited by examiner

*Primary Examiner*—Minh Loan Tran
(74) *Attorney, Agent, or Firm*—Toan P. Vo; Noreen C. Johnson

(57) ABSTRACT

The phosphor $A_2DSi_2O_7:Eu^{2+}$, where A is at least one of Ba, Sr, Ca and D is Mg and Zn absorbs UV light, for example from an LED, and converts the UV light to green light. The phosphor can be combined with a red phosphor such as $Y_2O_3:Eu^{3+},Bi^{3+}$ and one or more blue phosphors such as SECA (($Sr,Ba,Ca)_5(PO_4)_3Cl:Eu^{2+}$) and BAM ($BaMg_2Al_{16}O_{27}:Eu^{2+}$) to produce white light. Also, a light emitting apparatus is disclosed which comprises at least one of a red, green and blue phosphor for absorbing and converting ultraviolet radiation from a light emitting semiconductor into visible light. A laser diode can be used to activate the phosphors to provide improved efficiency and brightness.

12 Claims, 6 Drawing Sheets

PHOSPHORS FOR LIGHT GENERATION FROM LIGHT EMITTING SEMICONDUCTORS

This application is a continuation-in-part (CIP) of U.S. Seri. No. 09/203,214, filed Nov. 30, 1998, which is a CIP of U.S. Ser. No. 09/144,134, filed Aug. 31, 1998, both of which are hereby incorporated by reference in their entirety. This application claims priority from Provisional Application Ser. No. 60/073,982, filed Feb. 6, 1998, which is incorporated by reference in its entirety.

FIELD OF THE INVENTION

The invention relates to phosphors. In particular, the invention relates to phosphor compositions for light emitting diodes and laser diodes.

BACKGROUND OF THE INVENTION

Semiconductor light emitters are well known in the art. Semiconductor light emitters include light emitting diodes (LEDs) and laser diodes. LEDs are devices of choice for many display applications because of the advantages LEDs have over other light sources. These advantages include a relatively small size, a low operating current, a naturally colored light, a low power consumption, a long life, a maintained high efficiency (power in versus light output), an acceptable dispersal of light, and a relatively low cost of manufacture compared to other light sources.

Applications for LEDs include the replacement of light sources, such as incandescent lamps, especially where a colored light source is desired. LEDs are often used as display lights, warning lights and indicating lights. LEDs are advantageous in such applications, because they emit light in a relatively narrow range of wavelengths corresponding to a particular color. LEDs have not conventionally been used for lighting applications where a bright white light is needed, due to their inherent color.

Recently, blue emitting LEDs have been used to provide a whitish light, for example as backlights in liquid crystal displays and as replacements for small conventional lamps and fluorescent lamps. As discussed in chapter 10.4 of "The Blue Laser Diode" by S. Nakamura et al., pages 216–221 (Springer 1997), incorporated herein by reference, white light LEDs can be fabricated by forming a ceramic phosphor layer on the output surface of a blue emitting semiconductor LED. The blue LED is an InGaN single quantum well LED, and the phosphor is a cerium doped yttrium aluminum garnet $Y_3Al_5O_{12}:Ce^{3+}$ ("YAG:Ce"). The blue light emitted by the LED excites the phosphor, causing it to emit yellow light. The blue light emitted by the LED is transmitted through the phosphor and is mixed with the yellow light emitted by the phosphor. The viewer perceives the mixture of blue and yellow light as white light.

However, the blue LED—YAG:Ce phosphor white light illumination system suffers from the following disadvantages. The blue LED—YAG:Ce phosphor system produces white light with a high color temperature ranging from 6000 K to 8000 K, which is comparable to sunlight, and a typical color rendering index (CRI) of about 70 to 75. While the blue LED—YAG:Ce phosphor illumination system with a relatively high color temperature and a relatively low CRI is acceptable to customers in the far east lighting markets, the customers in the North American markets generally prefer an illumination system with a lower color temperature, while the customers European markets generally prefer an illumination system with a high CRI. For example, North American customers generally prefer systems with color temperatures between 3000 K and 4100 K, while European customers generally prefer systems with a CRI above 90.

The color temperature of a light source refers to the temperature of a blackbody source having the closest color match to the light source in question. Generally, as the color temperature increases, the light becomes more blue. As the color temperature decreases, the light appears more red. The color rendering index (CRI) is a measure of the degree of distortion in the apparent colors of a set of standard pigments when measured with the light source in question as opposed to a standard light source. Light sources having a relatively continuous output spectrum, such as incandescent lamps, typically have a high CRI, e.g. equal to or near 100. Light sources having a multi-line output spectrum, such as high pressure discharge lamps, typically have a CRI ranging from about 50 to 80.

Another disadvantage of the above LED lamp relates to the efficiency of the lamp. The lumens per watt (LPW) of the above-described LED is in a range of about 5 LPW to about 10 LPW. LED radiation at about 5 LPW to about 10 LPW with a CRI of about 70–75 may not be acceptable for many lighting applications. For example, many lighting applications require a LPW that is 15 LPW or more, with a CRI maintained at or above 85. Known LED light sources do not provide a single LED with a sufficient LPW and CRI for most generalized lighting applications, especially for white light.

Therefore, a semiconductor light source that produces a bright white light is needed. Also, efficient green light emitting phosphors are needed for phosphor conversion material blends to produce a bright white light.

SUMMARY OF THE INVENTION

Accordingly, the invention provides light source that overcomes the above-noted deficiencies. The invention also provides phosphors that produce light that when combined with other lights produce a bright white light.

In accordance with one embodiment of the invention, a phosphor $Ca_8Mg(SiO_4)_4Cl_2:Eu^{2+},Mn^{2+}$ absorbs ultraviolet radiation from a light emitting diode and converts the radiation into visible light.

In another embodiment of the invention a phosphor, $Y_2O_3:Eu^{3+},Bi^{3+}$ absorbs ultraviolet radiation from a light emitting diode and converts the radiation into visible light.

In a further embodiment of the invention a phosphor $A_2DSi_2O_7:Eu^{2+}$, wherein A is one or more of Ba, Ca, Sr, and D is Mg and Zn, absorbs ultraviolet radiation from a light emitting diode and converts the radiation into visible light.

Yet another embodiment of the invention is a phosphor conversion material blend comprising green, red and blue phosphors that absorb ultraviolet radiation from a light emitting diode, and convert the radiation into visible bright white light. The green phosphor comprises $Ca_8Mg(SiO_4)_4Cl_2:Eu^{2+},Mn^{2+}$, the red phosphor comprises $Y_2O_3:Eu^{3+},Bi^{3+}$, and the blue phosphor comprises known blue phosphors, such as $(Sr,Ba,Ca)_5(PO_4)_3Cl:Eu^{2+}$ and $BaMg_2Al_{16}O_{27}:Eu^{2+}$.

Furthermore, another embodiment of the invention provides an LED including a phosphor comprising $Ca_8Mg(SiO_4)_4Cl_2:Eu^{2+},Mn^{2+}$ capable of absorbing ultraviolet radiation and converting the radiation into a green visible light.

In a yet further embodiment of the invention, an LED includes a phosphor comprising $(Sr,Ba,Ca)_5(PO_4)_3Cl:Eu^{2+}$ and $BaMg_2Al_{16}O_{27}:Eu^{2+}$ capable of absorbing ultraviolet radiation and converting the radiation into blue visible light.

In a further embodiment of the invention, an LED includes a phosphor comprising $Y_2O_3:Eu^{3+},Bi^{3+}$ capable of absorbing ultraviolet radiation and converting the radiation into red visible light.

In a still further embodiment of the invention, an LED includes a phosphor comprising $A_2DSi_2O_7:Eu^{2+}$, where A is one or more of Ba, Ca, Sr, and D is Mg and Zn, capable of absorbing ultraviolet radiation and converting the radiation into green visible light.

Another embodiment of the invention provides an LED with a phosphor conversion material blend that comprises $Ca_8Mg(SiO_4)_4Cl_2:Eu^{2+},Mn^{2+}$, $Y_2O_3:Eu^{3+},Bi^{3+}$, and $(Sr,Ba,Ca)_5(PO_4)_3Cl:Eu^{2+}$ and $BaMg_2Al_{16}O_{27}:Eu^{2+}$ to absorb ultraviolet radiation from a light emitting diode and convert the radiation into visible bright white light.

According to another embodiment of the invention, a lighting apparatus is provided which comprises a semiconductor light emitting element such as an LED or a laser diode, a red emitting phosphor, a blue emitting phosphor, and the green emitting phosphor $A_2DSi_2O_7:Eu^{2+}$, where A is one or more of Ba, Ca, Sr, and D is Mg and Zn.

According to another embodiment of the invention, a lamp is provided which comprises a laser diode which emits radiation, a transmissive body fixed to the laser diode through which radiation from the laser diode propagates, and at least one phosphor fixed with respect to the transmissive body which converts the radiation to radiation of a different wavelength. The transmissive body may comprise a glass or plastic material which encapsulates the laser diode, wherein the phosphor is formed on a surface of the transmissive body. The lamp may further comprise a plurality of scattering particles dispersed within the transmissive body to scatter the radiation emitted from the laser diode.

The invention also relates to a method of producing light comprising the steps of generating radiation with a semiconductor laser diode, and converting at least a portion of the radiation to a different wavelength with at least one phosphor.

These and other aspects, advantages and salient features of the invention will become apparent from the following detailed description in conjunction with the drawings.

DETAILED DESCRIPTION OF THE INVENTION

Figure 1:
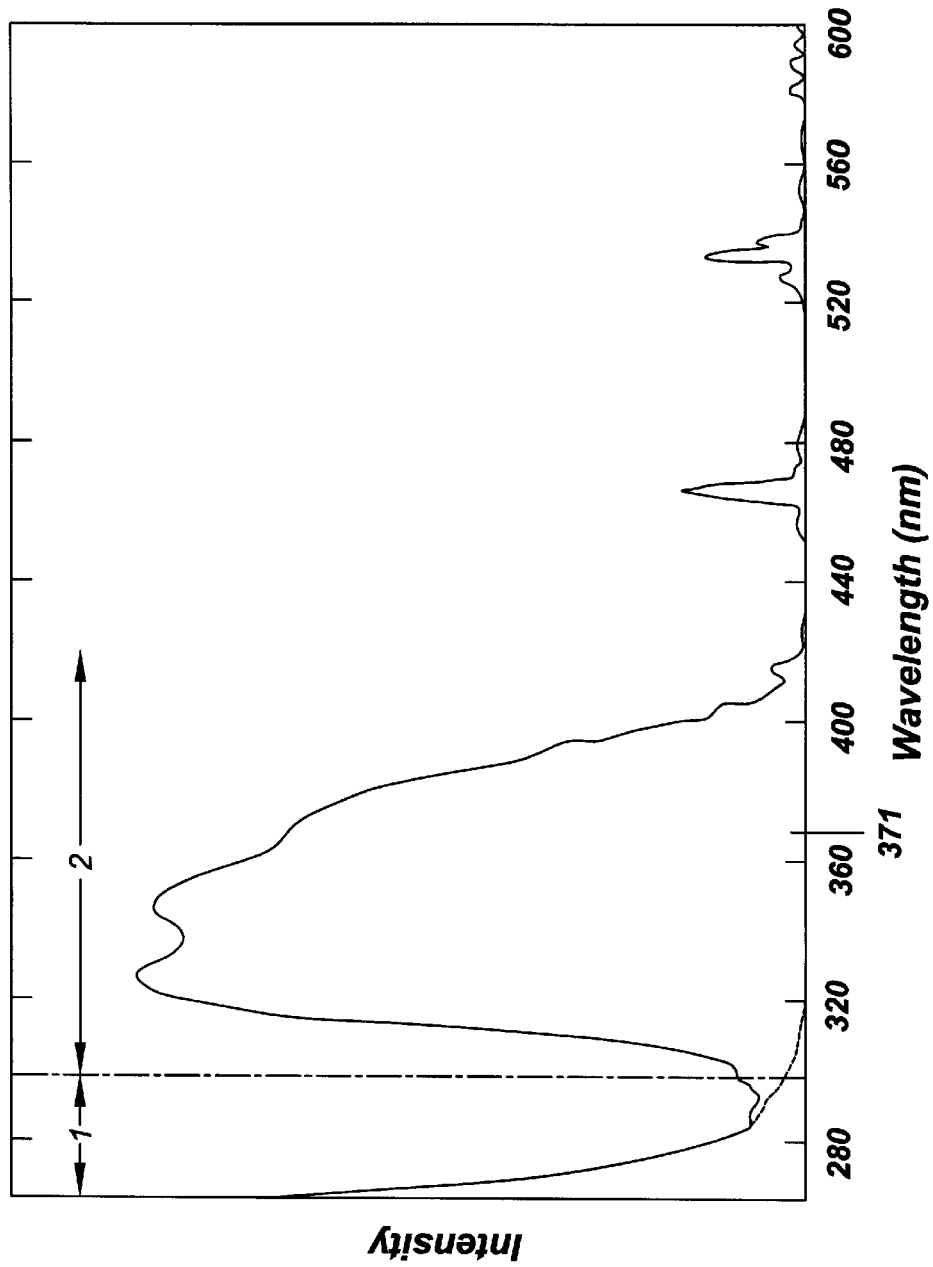
FIG. 1 is a graph of intensity versus wavelength for the absorption of light by a red phosphor.

Phosphors convert radiation to visible light. Different combinations of phosphors provide different colored light emissions. The colored light that originates from the phosphors has a particular color temperature.

A fluorescent lamp conversion phosphor material blend converts generated radiation to visible light. The fluorescent light color is dependent on the particular components of the material blend. The material blend may include one or more basic color emitting phosphors, for example a particular mix with one or more of red, green and blue phosphors to emit a desired color of light.

Known fluorescent lamp material blends absorb radiation with a wavelength at about 254 nm (ultraviolet). The radiation is produced by exciting photons, normally generated by a mercury plasma in a fluorescent lamp tube. The fluorescent light is produced by the material blend absorbing UV radiation and subsequently emitting visible light.

However, the known fluorescent lamp material blends do not successfully convert radiation from other sources at different wavelengths into useful visible light. The failure is due, at least in part, to the material blend being specifically developed to convert radiation at about 254 nm to visible light. These known material blends do not contain appropriate materials to efficiently absorb radiation with a wavelength other than about 254 nm.

LEDs emit radiation that is typically not converted into visible light by known fluorescent material blends. For example, some LEDs emit radiation generally in a wavelength of about 370 nm. Radiation in this wavelength will not be efficiently converted by known fluorescent material blends into useful visible light.

It was determined that an LED that produces a bright white light would be useful as a light source. Therefore, in one embodiment of the invention, phosphors for a luminescent material phosphor conversion material blend are provided to convert radiation from an LED into visible light. Further, it was determined that phosphors that convert LED radiation and emit a high-quality colored light (light with a wavelength approximately at a center of a wavelength range for a particular color) are useful. The individual phosphors and a phosphor conversion material blend including the individual phosphors convert radiation at a specified wavelength into visible light. The visible light provided by the phosphor conversion material blend comprises a bright white light with high intensity and brightness.

In the following discussion, the wavelength of the radiation source, such as an LED, is described as being about 370 nm. This is merely exemplary of the wavelengths emitted by an LED radiation source. LED emitted radiation within the scope of the invention is typically in a range between about 330 nm to about 420 nm, preferably between 370 and 405 nm. For example the LED may have the following wavelengths: 370, 375, 380, 390 or 405 nm. The LED radiation may also include blue wavelengths. Also, the radiation source is described as an LED, however, this is merely exemplary and not meant to limit the invention. Other semiconductor radiation sources, such as, but not limited to, semiconductor laser diodes, are within the scope of the invention.

According to exemplary embodiments of the invention, phosphor conversion material blends for LEDs comprise rare earth-activated phosphors. These rare earth-activated phosphors convert LED radiation at about 370 nm to visible light. Known phosphors are poor absorbers of 370 nm radiation. The poor absorption is overcome by incorporating suitable sensitizers (activators) into the phosphors. The sensitizers comprise ions that are incorporated into the phosphors, absorb radiation at about 370 nm radiation, and then transfer the absorbed energy to emitting ions which emit visible light.

One phosphor conversion material blend for an LED, as embodied by the invention, comprises $Y_2O_3:Eu^{3+},Bi^{3+}$, as a red-light emitting component; $Ca_8Mg(SiO_4)_4Cl_2:Eu^{2+},Mn^{2+}$ as a green light emitting component; in combination with a blue-light emitting phosphor, for example at least one of SECA (($Sr,Ba,Ca)_5(PO_4)_3Cl:Eu^{2+}$) and BAM ($BaMg_2Al_{16}O_{27}:Eu^{2+}$) phosphors. These three phosphors in a phosphor conversion material blend generate bright white light with high intensity and brightness from LED radiation. A phosphor conversion material blend, in accordance with an exemplary composition of an embodiment of the invention, comprises red phosphors provided in a range between about 40% to about 80%, green phosphors provided in a range between about 20% to about 50%, and blue phosphors provided in a range between about 5% and about 25%, all weight percent.

The amount of each respective phosphor is dependent on the desired color temperature of the light.

SECA and BAM phosphors are known in the art and described in U.S. Pat. No. 4,786,841 to Fohl et al. and U.S. Pat. No. 4,075,532 to Piper et al., respectively. Accordingly, a further description of these well known phosphors is omitted.

The $Y_2O_3:Eu^{3+},Bi^{3+}$ phosphor, as embodied by the invention, emits red light. Non-sensitized $Y_2O_{3+}:Eu^{3+}$ is a known fluorescent lamp phosphor which exhibits a near unity quantum efficiency (the ratio of the number of photons emitted to the number of photons absorbed) for radiation at about 254 nm. However, this red light emitting phosphor does not satisfactorily absorb LED radiation at about 370 nm.

Therefore, $Bi^{3+}$ is added to the $Y_2O_3:Eu^{3+}$ phosphor as a sensitizer. This sensitizer provides for the absorption of radiation in the range of 370 nm. Also, the $Bi^{3+}$ sensitizer enhances transfer of incident excitation radiation and generates an efficient red light emission within the red light spectrum.

FIG. 1 illustrates a graph of the absorption of radiation by $Y_2O_3:Eu^{3+},Bi^{3+}$. The solid curve in FIG. 1 illustrates absorption of radiation by $Y_2O_3:Eu^{3+},Bi^{3+}$. The continued dashed curve illustrates absorption of $Y_2O_3:Eu^{3+}$ without a $Bi^{3+}$ sensitizer. As illustrated, $Y_2O_3:Eu^{3+}$ does not absorb radiation with a wavelength of about 370 nm. The curve at area 2 illustrates absorption of LED 370 nm radiation by $Y_2O_3:Eu^{3+},Bi^{3+}$. As illustrated, the $Bi^{3+}$ sensitizer provides an absorption peak at wavelengths including 370 nm, as emitted by an LED.

Figure 2:
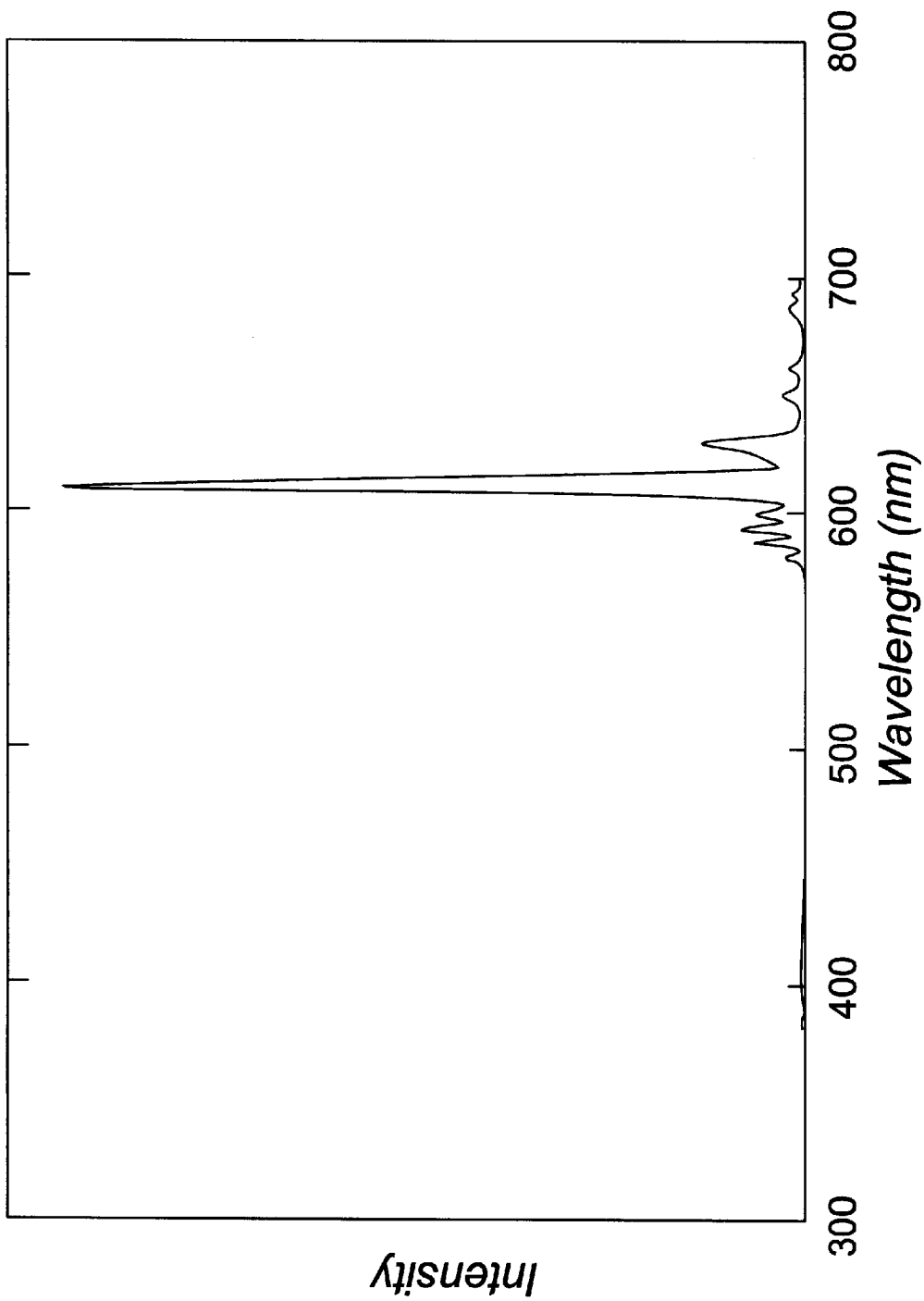
FIG. 2 is a graph of intensity versus wavelength for the emission of light by a red phosphor.

FIG. 2 illustrates a graph of the emission of $Y_2O_3:Eu^{3+},Bi^{3+}$. The emission of $Y_2O_3:Eu^{3+},Bi^{3+}$ provides a wavelength peak corresponding to high-quality red light. Accordingly, the $Y_2O_3:Eu^{3+},Bi^{3+}$ adequately and satisfactorily absorbs LED ultraviolet radiation in the range of 370 nm and converts it into high quality red light.

A known green-light emitting fluorescent phosphor comprises $Ca_8Mg(SiO_4)_4Cl_2:Eu^{2+}$. $Ca_8Mg(SiO_4)_4Cl_2:Eu^{2+}$ does not produce a high-quality green light. The $Ca_8Mg(SiO_4)_4Cl_2:Eu^{2+}$ emits a greenish-tinted light with a wavelength at about 500 nm to about 505 nm, which is on a low side of a green light spectrum. While this greenish-tinted light is acceptable for some applications, visible light in this range is generally inadequate for true green light applications. Also, the greenish-tinted light, when combined with other light, produces a white light having an intensity and brightness which may be unsatisfactory in some applications.

Figure 3:
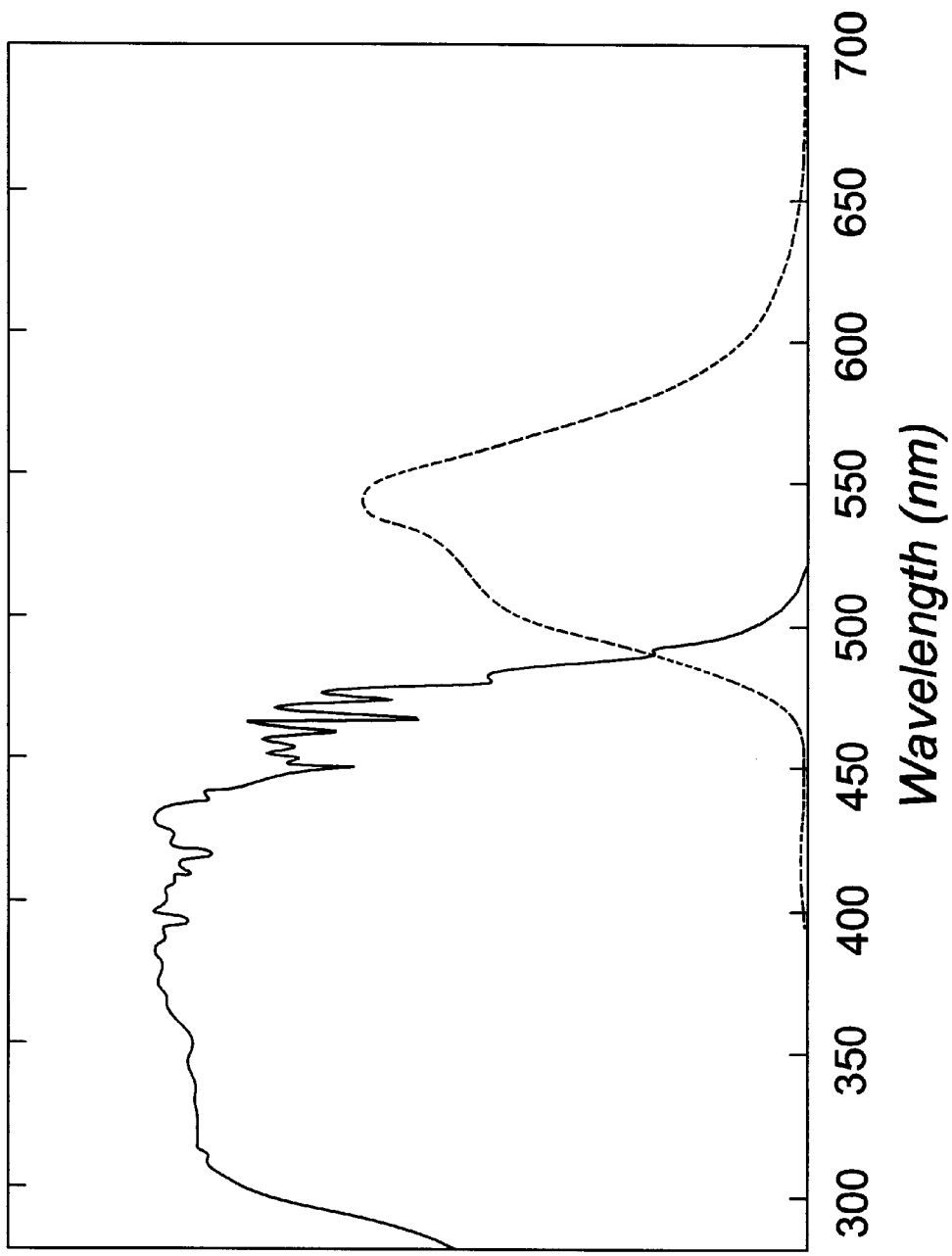
FIG. 3 is a graph of intensity versus wavelength for the absorption and emission of light by a green phosphor.

FIG. 3 is a graph of absorption and emission by $Ca_8Mg(SiO_4)_4Cl_2:Eu^{2+},Mn^{2+}$. The solid curve in FIG. 3 indicates absorption by $Ca_8Mg(SiO_4)_4Cl_2:Eu^{2+},Mn^{2+}$. The dashed curve in FIG. 3 (toward the right side) indicates emission by $Ca_8Mg(SiO_4)_4Cl_2:Eu^{2+},Mn^{2+}$, where the emission includes 540 nm, and exhibits a clear high quality green light.

Figure 4:
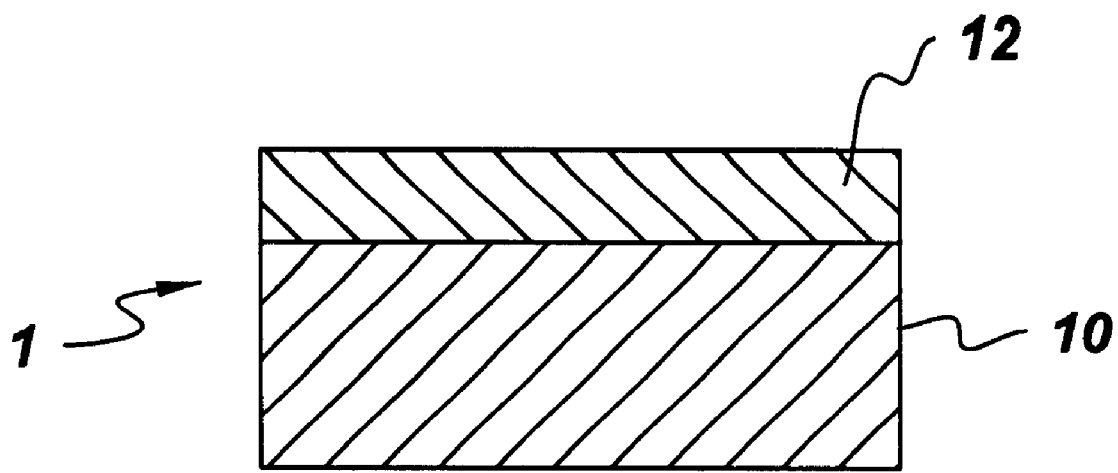
FIG. 4 illustrates an example of an light emitting assembly.

FIG. 4 illustrates an exemplary light emitting assembly 1, in accordance with one embodiment of the invention. The light emitting assembly 1 comprises a semiconductor ultraviolet radiation source, such as an LED 10, and a phosphor conversion material blend 12. The phosphor conversion material blend 12 is radiationally coupled to the LED 10 to receive radiation from the LED 10. Radiationally coupled means that the elements are associated with each other so radiation from one is transmitted to the other. The phosphor conversion material blend 12 is deposited on the LED 10 by any appropriate method, such as, but not limited to, applying the red, green, and blue phosphors together. For example, a water based suspension of the three phosphors can be formed, and applied to the LED surface. This method is merely exemplary of possible positionings of the phosphor conversion material blend 12 and LED 10. Alternatively, the phosphor conversion material blend 12 can be placed on a cover, lens or other optical feature associated with the LED 10 to absorb and convert energy as long as the phosphor conversion material blend 12 is radiationally coupled to the LED 10.

The phosphor conversion material blend 12 typically comprises separate blue, green, and red phosphors. The separate phosphors are provide in ranges to provide a white light with high intensity and brightness. For example, one phosphor conversion material blend 12, as embodied by the invention, comprises $Y_2O_3:Eu^{3+},Bi^{3+}$, as a red-light emitting component; $Ca_8Mg(SiO_4)_4Cl_2:Eu^{2+},Mn^{2+}$ as a green light emitting component; and a blue-light emitting phosphor. The blue-light emitting phosphor comprises at least one phosphor selected from $(Sr,Ba,Ca)_5(PO_4)_3Cl:Eu^{2+}$ (SECA) and $BaMg_2Al_{16}O_{27}:Eu^{2+}$ (BAM) phosphors.

Visible light obtained from a single LED comprising the above-disclosed phosphor conversion material blend provides a bright white light. For example, the resultant bright white light with high intensity and brightness has a color temperature at about 4100 K and a CRI of about 85. With an LED efficiency of about 12%, the LED will produce about 20 LPW. Further, with a color temperature at about 5000 K, a CRI of at least about 86 is obtained with about a 20 LPW. Therefore, a single LED with a phosphor conversion material blend, as embodied by the invention, provides a superior LPW, for example at least about 20 LPW and preferably at least about 25 LPW, with a CRI of at least 84 or greater.

Figure 5:
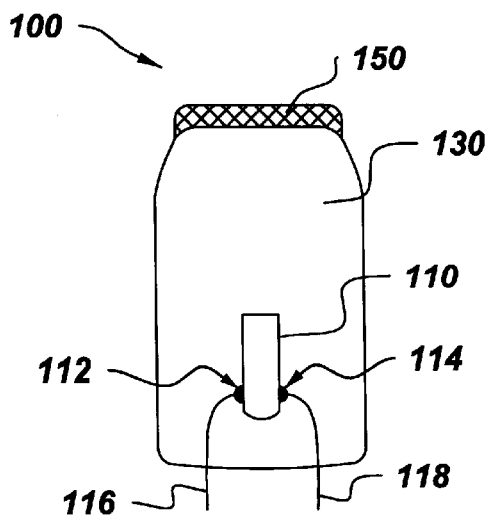
FIG. 5 illustrates a lamp according to an exemplary embodiment of the invention.

FIG. 5 illustrates a lamp according to another embodiment of the invention. As shown in FIG. 5, the lamp 100 includes a light source 110, a transmissive body 130, and a luminescent material 150 which typically comprises at least one phosphor. The light source 110 may be an LED or a laser diode, for example, which includes positive and negative contacts 112, 114, respectively. The positive and negative contacts supply electric current to the light source 110 via leads 116, 118. The light source 110, the contacts 112, 114, and a portion of the leads 116, 118 are encapsulated in the transmissive body 130, which may comprise a material such as plastic, glass, or silicone which is transmissive to radiation in the visible and UV wavelengths. The transmissive body 130 is preferably chemically stable in the presence of UV radiation.

The light source 110 preferably emits light in the UV wavelengths, for example light having a wavelength of 330–420 nanometers (nm), typically in a range of 370–405 nm. Examples of laser diodes which emit UV or blue radiation are described, for example, in U.S. Pat. Nos. 5,604,763 and 5,644,584. Laser diodes and LEDs which emit UV and blue radiation are also described in Shuji Nakamura and Gerhard Fasol, "The Blue Laser Diode" (1997).

Typically, a combination of three phosphors, red, green, and blue is employed. An example of a suitable phosphor which absorbs UV radiation and emits red light is: $Y_2O_3:Eu^{3+},Bi^{3+}$. Examples of phosphors which absorb UV radiation and emit green light include: $Ca_8Mg(SiO_4)_4Cl_2:Eu^{2+},Mn^{2+}$; $Ba_2SiO_4:Eu^{2+}$; $Ba_2(Mg,Zn)Si_2O_7:Eu^{2+}$; and $(Ba,Sr)Al_2O_4:Eu^{2+}$. Phosphors which absorb UV radiation and emit blue light include: $(Ba,Sr,Ca)_5(PO_4)_3Cl:Eu^{2+}$; $BaMg_2Al_{16}O_{27}:Eu^{2+}$ and $BaMgAl_{10}O_{17}:Eu^{2+}$.

In the above phosphors, the element following the colon represents an activator. The notation (A,B,C) signifies $(A_x, B_y, C_z)$ where $0 \leq x \leq 1$ and $0 \leq y \leq 1$ and $0 \leq z \leq 1$ and $x+y+z=1$. For example, (Sr,Ca,Ba) signifies $(Sr_x,Ca_y,Ba_z)$ where $0 \leq x \leq 1$ and $0 \leq y \leq 1$ and $0 \leq z \leq 1$ and $x+y+z=1$. Typically, x, y, and z are all nonzero. The notation (A,B) signifies $(A_x, B_y)$ where $0 \leq x \leq 1$ and $0 \leq y \leq 1$ and $x+y=1$. Typically, x and y are both nonzero.

The phosphor $Ba_2(Mg,Zn)Si_2O_7:Eu^{2+}$, which absorbs UV light and emits green light, provides advantages over the known phosphors $Ba_2ZnSi_2O_7:Eu^{2+}$ and $Ba_2MgSi_2O_7:Eu^{2+}$.

The known phosphor $Ba_2MgSi_2O_7:Eu^{2+}$ has a relatively high quantum efficiency. However, the synthesis temperature for $Ba_2MgSi_2O_7:Eu^{2+}$ is also relatively high. A high synthesis temperature, e.g. 1300° C and above, can result in the formation of a glassy phase during synthesis. Formation of a glassy phase reduces the quantum efficiency of the material.

The known phosphor $Ba_2ZnSi_2O_7:Eu^{2+}$ has a lower synthesis temperature than that of $Ba_2MgSi_2O_7:Eu^{2+}$. However, the quantum efficiency of $Ba_2ZnSi_2O_7:Eu^{2+}$ is also inherently lower than that of $Ba_2MgSi_2O_7:Eu^{2+}$.

The inventor has discovered that the addition of an appropriate amount of zinc lowers the synthesis temperature of $Ba_2(Mg,Zn)Si_2O_7:Eu^{2+}$ to avoid formation of a glassy phase, while the presence of a significant amount of Mg produces a phosphor with a relatively high quantum efficiency.

The phosphor composition $Ba_2(Mg,Zn)Si_2O_7:Eu^{2+}$ can be expressed generally as $A_2DSi_2O_7:Eu^{2+}$ where A is Ba and D is Mg and Zn. A can also include one or more of Ca and Sr, if desired. The phosphor composition can therefore be expressed generally as $(Ba_{1-X-Y-Z},Ca_X,Sr_Y,Eu_Z)_2(Mg_{1-W},Zn_W)Si_2O_7$. According to one embodiment, the composition has the following ranges: $X+Y+Z=1$; $Z>0$; and $0.05 \leq W \leq 0.50$. According to another embodiment, $X+Y+Z=1$; $0.1 \leq W \leq 0.3$ and $0.01 \leq Z \leq 0.1$. Either of X and Y can be zero or non-zero. These ranges produce a phosphor with a relatively high quantum efficiency due to the inclusion of zinc for lower synthesis temperature and avoidance of a glassy phase combined with a sufficient amount of Mg for enhanced efficiency.

To make $A_2DSi_2O_7:Eu^{2+}$, starting compounds are manually blended or mixed in a crucible or mechanically blended or mixed in another suitable container, such as a ball mill, to form a starting powder mixture. The starting compounds may comprise any oxide, hydroxide, oxalate, carbonate and/or nitrate starting phosphor compound, for example. The preferred starting materials comprise barium carbonate ($BaCO_3$), magnesium oxide (MgO), zinc oxide (ZnO), europium oxide ($Eu_2O_3$), and silicic acid ($SiO_2 \cdot xH_2O$). Typically, a flux, such as $BaF_2$, $MgF_2$, $ZnF_2$ and/or $EuF_3$ is added to the starting materials in an amount of 0.5 to 3 mole percent per mole of the phosphor produced. Calcium and strontium starting compounds, such as their carbonate or oxide compounds, may also be added if it is desired to substitute some or all of the barium with calcium and/or strontium.

The starting powder mixture is then fired a first time in a carbon containing atmosphere, such as in a coconut charcoal containing atmosphere at 900° to 1250° C. for 5 to 7 hours to form a first calcined phosphor body or cake. The resultant cake is then ground and milled to a powder. This powder is then annealed or fired a second time in a reducing atmosphere at about 900° to 1200° C. to form a second calcined phosphor body or cake. Preferably the powder is annealed in a furnace in an atmosphere comprising nitrogen and 0.05% to 10% hydrogen for two to six hours, and subsequently cooled in the same atmosphere.

The solid calcined phosphor body may be converted to a phosphor powder in order to easily coat the phosphor powder onto a lamp. The solid phosphor body may be converted to the phosphor powder by any crushing, milling or pulverizing method, such as wet milling, dry milling, jet milling or crushing. Preferably, the solid body is wet milled in propanol, ethanol, methanol and/or water, and subsequently dried.

Figure 8:
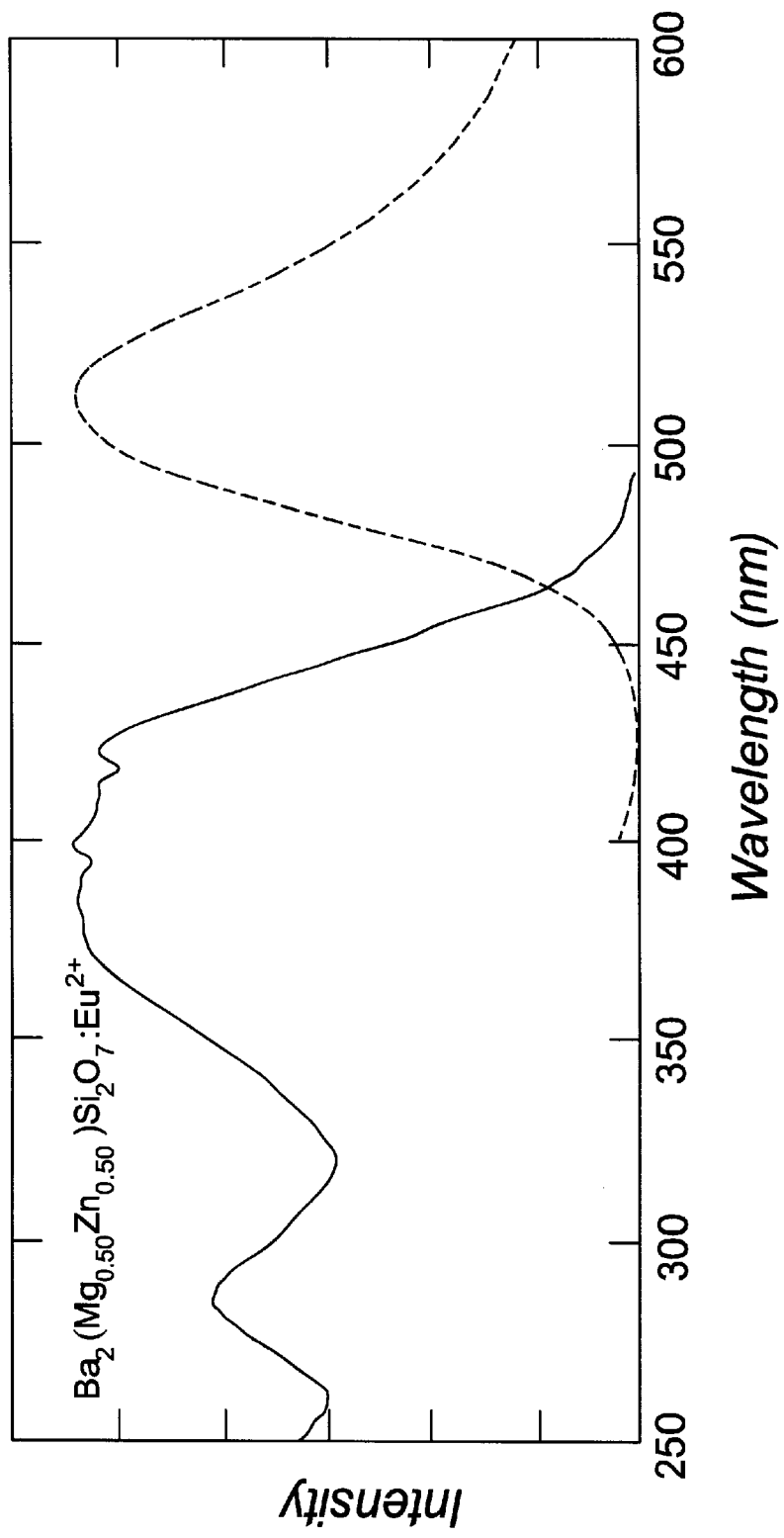
FIG. 8 is a graph of absorption and emission spectra for the green emitting phosphor $Ba_2(Mg,Zn)Si_2O_7:Eu^{2+}$.

FIG. 8 shows the excitation and emission spectra of a sample of $(Ba_{1-X-Y-Z},Ca_X,Sr_Y,Eu_Z)_2(Mg_{1-W},Zn_W)Si_2O_7$ having the following composition: W=0.5, X=0, Y=0, and Z=0.01. As shown in FIG. 8, the phosphor $(Ba_{1-X-Y-Z},Ca_X,Sr_Y,Eu_Z)_2(Mg_{1-W},Zn_W)Si_2O_7$ has an absorption spectra which efficiently absorbs UV light of wavelengths 360–420 nm. The phosphor also produces a high intensity green emission.

The phosphor $(Ba_{1-X-Y-Z},Ca_X,Sr_Y,Eu_Z)_2(Mg_{1-W},Zn_W)Si_2O_7$ can be combined with the blue and red phosphors described above to form a tri-phosphor blend, which produces white light from a UV LED or laser diode. The $A_2DSi_2O_7:Eu^{2+}$ phosphor can also be combined alone with a UV LED or laser diode. As will be appreciated by those skilled in the art, other blends can be formulated to produce a desired color temperature and CRI.

Referring again to FIG. 5, typically a mixture of red, green and blue emitting phosphors is prepared and applied to the outside of the transmissive body 130 with a water-based suspension of the phosphors, for example. After removal of the liquid component of the suspension, a protective transparent outer layer such as silicone may be applied over the phosphor layer. The phosphor layer may have a thickness of about 16–30 microns, for example.

The relative proportion of red, green, and blue emitting phosphors is typically about 50–70 weight percent red, 25–40 weight percent green, and 5–20 weight percent blue.

Figure 6:
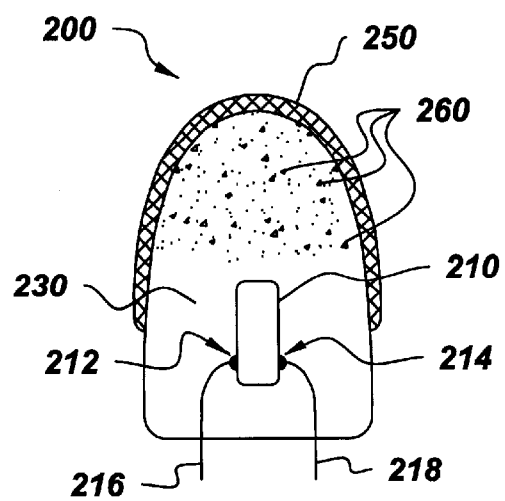
FIG. 6 illustrates a lamp which includes a laser diode according to another embodiment of the invention.

FIG. 6 illustrates a lamp according to another embodiment of the invention. As shown in FIG. 6, the lamp 200 includes a laser diode 210, a transmissive body 230, and a luminescent material 250. The laser diode includes positive and negative contacts 212, 214, respectively, which supply electric current to the laser diode 210 via leads 216, 218. The laser diode 210, the contacts 212, 214, and a portion of the leads 216, 218 are encapsulated in the transmissive body 230, which may comprise a plastic, glass or silicone material which is transmissive in the visible and UV wavelengths.

The lamp 200 also includes a plurality of scattering particles 260 which are embedded in the transmissive body 230. The scattering particles may comprise $Al_2O_3$ particles such as CR30 alumina powder available from Baikowski. The scattering particles may also comprise $TiO_2$ particles, for example. The particles 260 effectively scatter the coherent light emitted from the laser diode 210, preferably with a negligible amount of absorption. The coupling of the diffuse scattered laser light with the luminescent material is advantageous in reducing optical saturation effects and physical damage of the luminescent material.

A luminescent material 250 such as a phosphor is typically formed on an outside surface of the transmissive body 230. The luminescent material 250 may cover substantially all of the outside surface of the transmissive body 230. The luminescent material 250 may comprise at least one phosphor, as disclosed above, which absorbs UV radiation and emits red, green, or blue light. The combination of red, green and blue light produces white light.

Figure 7:
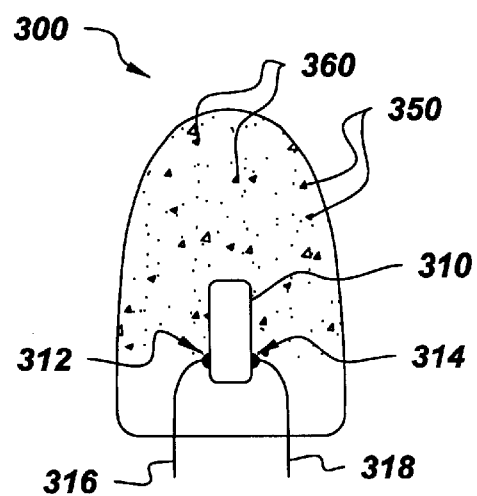
FIG. 7 illustrates a lamp which includes a laser diode according to another embodiment of the invention.

FIG. 7 illustrates a laser diode lamp according to another embodiment of the invention. As shown in FIG. 3, the lamp 300 includes a laser diode 310 and a transmissive body 330. The laser diode 310 includes positive and negative contacts 312, 314, respectively, which supply electric current to the laser diode 310 via leads 316, 318. The laser diode 310, the contacts 312, 314, and a portion of the leads 316, 318 are encapsulated in the transmissive body 330, which may comprise a plastic, glass, or silicone material which is transmissive in the visible and UV wavelengths.

The lamp 300 also includes both luminescent particles 350 and scattering particles 360. The luminescent particles 350 may comprise one or more powdered phosphor materials, as described above, which absorb the UV light emitted from the laser diode 310 and emit light of a longer wavelength, e.g. red, green, and/or blue. The scattering particles 360 may comprise $TiO_2$ or $Al_2O_3$ powder, for example.

The embodiments which include a laser diode typically have a large efficacy and operate at a high optical power. The laser diode has a high efficacy and optical power because it relies on stimulated rather than spontaneous emission, which reduces absorption losses. In addition, since most of the light is emitted normal to the surface of a laser diode, internal reflection losses are reduced.

Other embodiments of the invention will be apparent to those skilled in the art from a consideration of this specification or practice of the invention disclosed herein. It is intended that the specification and examples be considered as exemplary only, with the scope and spirit of the invention being defined by the following claims.

What is claimed is:

1. A composition of matter comprising $Ba_2(Mg,Zn)Si_2O_7:Eu^{2+}$.

2. A composition of matter comprising
$(Ba_{1-X-Y-Z},Ca_X,Sr_Y,Eu_Z)_2(Mg_{1-W},Zn_W)Si_2O_7$, wherein
$X+Y+Z \leq 1$;
$Z>0$; and
$0.05 \leq W \leq 0.50$.

3. The composition of claim 2, wherein
$0.1 \leq W \leq 0.3$.

4. The composition of claim 3, wherein
$0.01 \leq Z \leq 0.1$.

5. The composition of claim 2, wherein
$X>0$.

6. The composition of claim 2, wherein
$Y>0$.

7. A lighting apparatus comprising:
a semiconductor ultraviolet light source; and
a phosphor comprising:
$(Ba_{1-X-Y-Z},Ca_X,Sr_Y,Eu_Z)_2(Mg_{1-W},Zn_W)Si_2O_7$, wherein
$X+Y+Z<1$;
$Z>0$; and
$0.05 \leq W \leq 0.5$.

8. The lighting apparatus of claim 7, wherein the semiconductor ultraviolet light source comprises an LED.

9. The composition of claim 8, wherein
$0.1 \leq W \leq 0.3$.

10. The composition of claim 9, wherein
$0.01 \leq Z \leq 0.1$.

11. The lighting apparatus of claim 7, wherein the semiconductor ultraviolet light source comprises a laser diode.

12. The lighting apparatus of claim 7, further comprising a red emitting phosphor and a blue emitting phosphor.

* * * * *